United States Patent [19]

Robertson et al.

[11] 4,077,832

[45] Mar. 7, 1978

[54] EPITAXIAL GROWTH OF BISMUTH RARE EARTH IRON GARNET FROM A FLUX OF BISMUTH OXIDE AND ALKALI METAL OXIDE

[75] Inventors: John M. Robertson, Eindhoven, Netherlands; John C. Brice, Copthorne Bank, England; John E. Davies, San Francisco, Calif.

[73] Assignee: U.S. Philips Corporation, New York, N.Y.

[21] Appl. No.: 729,901

[22] Filed: Oct. 6, 1976

[30] Foreign Application Priority Data

Oct. 7, 1975    United Kingdom ............... 40990/75

[51] Int. Cl.² .................... B01J 17/04; B01J 17/06; C01G 29/00
[52] U.S. Cl. .............. 156/624; 156/DIG. 63; 156/DIG. 74; 156/DIG. 79; 252/62.57; 423/594
[58] Field of Search .............. 156/DIG. 63, DIG. 79, 156/624, 617 SP, DIG. 74; 252/62.57; 423/594, 263

[56] References Cited

U.S. PATENT DOCUMENTS

| | | |
|---|---|---|
| 3,150,925 | 9/1964 | Gambino ............................... 423/594 |
| 3,177,145 | 4/1965 | Brownlow ........................ 252/62.57 |
| 3,281,363 | 10/1966 | Geller ................................ 252/62.57 |
| 3,479,132 | 11/1969 | Wickham ............................ 423/594 |
| 3,638,207 | 1/1972 | Smith ................................ 252/62.57 |
| 3,654,162 | 4/1972 | Buhrer .............................. 252/62.57 |
| 3,666,665 | 5/1972 | Chapman .......................... 252/62.57 |
| 3,838,450 | 9/1974 | Borgers ............................. 252/62.57 |
| 3,915,661 | 6/1974 | Vichs ................................. 423/263 |
| 3,947,372 | 3/1976 | Shinagawa ........................ 252/62.57 |

FOREIGN PATENT DOCUMENTS 1,233,261  5/1960  France ................... 156/DIG. 63

OTHER PUBLICATIONS

Akselrad et al., AIP Conf. Proc., No. 18, prog. 2 (1973), pp. 949–953.

*Primary Examiner*—Stephen J. Emery
*Attorney, Agent, or Firm*—Frank R. Trifari; Norman N. Spain

[57] ABSTRACT

A method of growing a monocrystalline bismuth rare earth iron garnet material from a melt in which a flux containing bismuth oxide and an alkali metal oxide is employed.

6 Claims, 1 Drawing Figure

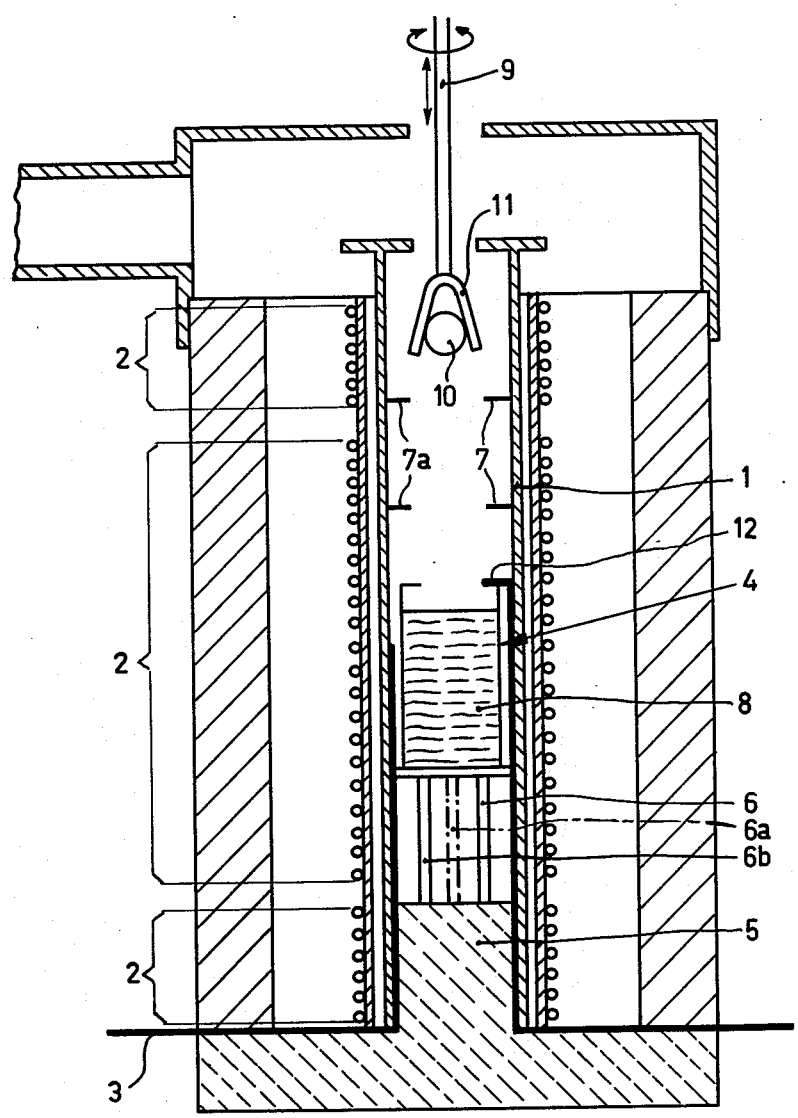

EPITAXIAL GROWTH OF BISMUTH RARE EARTH IRON GARNET FROM A FLUX OF BISMUTH OXIDE AND ALKALI METAL OXIDE

The invention relates to a method of growing a monocrystalline bismuth rare earth iron garnet material either as a single crystal or as a monocrystalline epitaxial layer from a melt which consists of a solution containing the composing components for the garnet material and a flux, to a single crystal grown by such a method, and to a substrate bearing a monocrystalline epitaxial layer grown by such a method.

In the last few years there has been an increasing interest in single crystals of rare earth iron garnet materials and in particular in monocrystalline thin films of such garnet materials. Throughout this specification, elements having the atomic numbers 21, 39 and 57 to 71 inclusive are considered to be rare earth elements. These monocrystalline thin films are used, for example, in magnetic bubble domain devices, in integrated optical ciruits which are operative for conducting and manipulating information-carrying light waves, and in devices for thermomagnetic recording and magneto-optical reading of information. It is known from U.S. Pat. No. 3,697,320 that various techniques are available to manufacture iron garnet single crystals. Epitaxial film growth methods have proved to be particularly suitable for making monocrystalline layers of these iron garnet materials. In these methods, for example, the layers may be grown by epitaxy from the liquid phase, so-called "liquid phase epitaxy" (LPE). In these methods growth takes place in a dipping device in which a monocrystalline garnet substrate is contacted with a melt containing a suitable solution of rare earth and iron oxides, and any other oxides if these are required. The substrate crystals are usually grown from a substantially stoichiometric melt by means, for example of the Czochralsky method. A solvent frequently used in LPE methods and in other flux growth methods is a flux which contains PbO, possibly with the addition of $PbF_2$ and/or $B_2O_3$ so as to control the dissolving power, the crystallization rate and the temperature range over which the crystallization is carried out (see Netherlands Patent Applications 7,301,311 and 7,115,765). A lead containing flux has proved to be particularly suitable for growing magneto-optically active garnet layers, which, in order to increase their magneto-optical effect, contain bismuth, because this enables the low growth temperature which is necessary to grow sufficient bismuth in the garnet film. According as the growth temperature is lower, more bismuth grows in the film (see German Offenlegungsschrift 2,349,348).

The use of lead-containing fluxes, however, suffers from the drawback that the grown film also comprises lead which causes a considerable optical absorption. However, films having the minimum possible optical absorption are required, notably for magneto-optical applications. Lead-free fluxes have been used to manufacture such films but the fluxes known hitherto (e.g. $BaO-BaF_2-B_2O_3$) generally exhibit the drawback of having the combination of a high viscosity and a high surface tension at the desired growth temperature. This prevents a clean separation of the film from the flux when the substrate bearing the epitaxial layer of garnet is removed from the melt on terminating growth, thus causing irregularities in the film surface. Also, a high viscosity may give rise to inhomogeneities in the melt and hence in the composition of the grown film. When such a growth temperature is chosen that the viscosity of the flux is sufficiently low to be useful, it is found that little or no bismuth is incorporated in the film.

It is the object of the invention to provide a lead-free flux which does not exhibit the above-mentioned drawbacks.

The invention provides a method of growing a monocrystalline bismuth rare earth (as hereinbefore defined) iron garnet as a single crystal or as a monocrystalline epitaxial layer from a melt which consists of a solution containing the composing components for the garnet material, and a flux, wherein the flux comprises a mixture of $Bi_2O_3$ and $Me_2O$ (where Me is at least one of the elements Li, Na, K, Rb, and Cs) wherein the system $Bi_2O_3-Me_2O$ includes a eutectic composition having a eutectic temperature which is below the melting temperature of pure $Bi_2O_3$. Within the scope of the present invention, said combinations constitute fluxes having a low surface tension, for example, a surface tension of less than 180 dyne cm$^{-1}$) for growing perfect rare earth-iron garnet single crystals comprising bismuth in a part of the rare-earth lattice sites.

In general the flux forms from 60 to 95 molar % of the melt.

Although said fluxes are useful for flux growing methods in general, for example the methods described in U.S. Pat. No. 3,697,320, they are particularly suitable for growth by liquid phase epitaxy.

The invention therefore relates in particular to a method in which a monocrystalline bismuth rare earth iron garnet layer is grown from a melt of the above-described composition on a crystal face by liquid phase epitaxy, which layer shows the crystallographic orientation of said crystal face, by contacting the crystal face with the melt and causing a layer of the composition of the layer to crystallize on the crystal face.

Within the scope of the invention, flux compositions can be chosen such that growth at temperatures between 600° and 900° C is possible.

It is found that the viscosity of the flux mixture at the growth temperature is not more than 16 centipoises. (The viscosity of pure $Bi_2O_3$, the use of which as a flux is known from Netherlands Patent Application 7,115,765, is only lower than 16 centipoises at temperatures above 900° C). According to an embodiment of the inventive method the viscosity can be lowered further by adding an oxide $RO_2$ to the flux mixture of a quadrivalent element (where R is at least one of the elements Si, Ge, Ti, Sn, Zr, Co, Hf and Te).

An extra advantage of the use of the fluxes according to the invention is that the bismuth rare earth iron garnet layers grown with them have a considerably lower magnetic anisotropy than bismuth rare earth iron garnet layers grown by means of lead fluxes. The use of bismuth rare earth iron garnet layers having a low magnetic anisotropy is important in devices for thermomagnetic recording of information.

By way of example, the invention will now be described with reference to the single FIGURE of the accompanying drawing and to Examples 1 to 5. Example A is outside the scope of the invention and is included for purposes of comparison. The FIGURE is a sectional elevation of an apparatus used to grow a monocrystalline layer by liquid phase epitaxy.

APPARATUS AND GROWTH PROCEDURE

The apparatus includes a furnace having a main ceramic tube 1 which is 35 cms. long and has an internal diameter of 6.5 cms. The furnace has a three-zone heating element 2 and by the use of three variable output transformers (not shown) it is possible to obtain a desired vertical temperature gradient. The transformers are controlled by a single Eurotherm controller (not shown) with the aid of a sensing thermocouple 3 near the middle heater zone. A 100 ml. platinum crucible 4 is supported on an alumina pedestal 5, but is separated from it by three alumina limbs 6, 6a and 6b so that there is an air space beneath the crucible. A platinum wire 12 clamped to the top of the crucible 4 earths the crucible so as to avoid interference with the thermocouple 3. The position of the crucible within the furnace is such that it is slightly lower than the middle of the middle heater zone. Above the crucible are two sets of platinum baffles 7 and 7a. By varying the spacing of these baffles, the fume extraction flow rate, the size of the air space beneath the crucible and by a suitable adjustment of the vertical temperature gradient, it is possible to minimise the convection currents in a melt 8 caused by radial temperature gradients. These radial temperature gradients can be reduced by using good insulation of the furnace. The vertical temperature gradient is such that the top of the crucible is hotter than the bottom by up to 10° C depending upon the size of the crucible. The convection in the melt 8 can be controlled over a 20 mm. diameter substrate.

Many workers rotate the substrate in the horizontal plane during film growth and there may be certain advantages in doing this. The apparatus described can also be used for this horizontal technique.

A typical method of growing an epitaxial layer is as follows. The melt composition is first homogenised at a temperature approximately 50° C above the temperature at which the garnet crystal will cease to grow. The homogenisation process may be accelerated by using a platinum paddle (not shown) fitted in place of a substrate holder 9 and rotated in the melt usually for approximately one hour. The rotation rate of the paddle is controlled by an electronic system which enables unidirectional rotation at up to 600 rpm. or accelerated rotation and reversal controlled by a function generator.

After the homogenisation period, the platinum paddle is removed from the melt and the furnace temperature is reduced to that required for film growth. Half an hour may elapse after the furnace has reached this temperature so that equilibrium conditions can establish in the melt 8. A substrate 10 which has been previously cleaned (using ultrasonics with organic cleaning agents) is placed into a specimen clamp 11. This in turn is connected to a lowering mechanism (not shown).

The substrate 10 is lowered into the furnace at a rate of 40 mm/min. This is continued until the substrate is hanging directly above the surface of the melt 8. The substrate is held in this position for from one to five minutes so that it acquires the same temperature as the melt 8. At the end of this period, the substrate 10 is lowered into the melt 8 and is rotated fairly fast so that there is not a substantial difference between the times of immersion of the upper and lower parts of the substrate when the substrate has been disposed in the vertical plane .

When the substrate holder 9 is in its desired position, the lowering mechanism is stopped, and rotation of the substrate holder 9 continues, if required.

When the deposition time is completed, the coated substrate 10 is removed from the melt. The removal rate of the coated substrate 10 into the cooler regions of the furnace is 40 mm/min until the coated substrate 10 is outside the furnace and may be removed from the apparatus.

EXAMPLE A

A 3.17 $\mu$m thick layer of $(Bi,Y)_3(Fe,Al)_5O_{12}$ was grown in five minutes on both sides of a substrate of $Gd_3Ga_5O_{12}$ by means of a dipping process using the apparatus described above with reference to the FIGURE. A melt was prepared consisting of

| 111.22 g | $Bi_2O_3$ | 15.3 (mol. %) |
| 265.75 g | Pb O | 75.80 |
| 0.86 g | $Y_2O_3$ | 0.24 |
| 20.83 g | $Fe_2O_3$ | 8.30 |
| 0.843 g | $Al_2O_3$ | 0.53 |

The temperature at which the layer was grown was approximately 802° C. The substrate was rotated. The resulting layer was epitaxial, monocrystalline, smooth, uniform in composition and thickness and free from defects.

EXAMPLE 1

A 2.33 $\mu$m thick layer of $(Bi,Yb)_3(Fe,Ga)_5O_{12}$ was grown in ten minutes on both sides of a substrate of $Gd_3Ga_5O_{12}$ by means of a dipping process using the apparatus described above with reference to the FIGURE. A melt was prepared consisting of

| 349.47 g | $Bi_2O_3$ | 73.43 mol. % |
| 20.51 g | $K_2CO_3$ | 14.59 |
| 3.63 g | $Yb_2O_3$ | 0.91 |
| 14.995 g | $Fe_2O_3$ | 9.23 |
| 3.5 g | $Ga_2O_3$ | 1.84 |

The substrate was not rotated. The temperature at which the layer was grown was approximately 702° C. The resulting layer was epitaxial, monocrystalline, smooth, uniform in composition and thickness and free from defects.

EXAMPLE 2

A 3.12 $\mu$m thick layer of $(Bi,Yb)_3(Fe,Ga)_5O_{12}$ was grown in ten minutes on both sides of a substrate of $Gd_3Ga_5O_{12}$ by means of a dipping process using the apparatus described above with reference to the FIGURE. A melt was prepared consisting of

| 349.47 g | $Bi_2O_3$ | 73.31 mol. % |
| 20.51 g | $K_2CO_3$ | 14.57 |
| 0.1 g | $SiO_2$ | 0.17 |
| 3.63 g | $Yb_2O_3$ | 0.90 |
| 14.995 g | $Fe_2O_3$ | 9.22 |
| 3.5 g | $Ga_2O_3$ | 1.83 |

The temperature at which the layer was grown was approximately 696° C. The substrate was not rotated. The resulting layer was epitaxial, monocrystalline, smooth, uniform in composition and thickness and was free from defects.

EXAMPLE 3

A 3.12 $\mu$m thick layer of $(Bi,Y)_3(Fe,Ga)_5O_{12}$ was grown in 30 minutes on both sides of a substrate of $Gd_3GaO_{12}$ by means of a dipping process using apparatus as described above with reference to the FIGURE. A melt was prepared consisting of

| 349.47 g | $Bi_2O_3$ | 75.29 mol % |
| --- | --- | --- |
| 20.51 g | $K_2CO_3$ | 14.96 |
| 2.07 g | $Y_2O_3$ | 0.93 |
| 10.995 g | $Fe_2O_3$ | 6.94 |
| 3.5 g | $Ga_2O_3$ | 1.88 |

The substrate was not rotated. The temperature at which the layer was grown was approximately 816° C. The resulting layer was epitaxial, monocrystalline, smooth, uniform in composition and thickness and free from defects.

EXAMPLE 4

A 6.8 μm thick layer of $(Bi,Gd)_3(Fe,Al,Ga)_5O_{12}$ was grown in 20 minutes on both sides of a substrate of $(Gd,Ca)_3(Ga,Zr)_5O_{12}$ by means of a dipping process using the apparatus described above with reference to the FIGURE. A melt was prepared consisting of

| 909.94 g | $Bi_2O_3$ | 76.74 mol % |
| --- | --- | --- |
| 2.35 g | $SiO_2$ | 1.54 |
| 23.66 g | $Na_2CO_3$ | 5.10 |
| 15.57 g | $Gd_2O_3$ | 1.69 |
| 45.68 g | $Fe_2O_3$ | 11.29 |
| 16.40 g | $Ga_2O_3$ | 3.45 |
| 0.5 g | $Al_2O_3$ | 0.19 |

The temperature at which the layer was grown was approximately 870° C. The substrate was not rotated. The resulting layer was epitaxial, monocrystalline, smooth, uniform in composition and thickness and free from defects.

The optical absorption coefficients α upon irradiation of the layers produced in Examples A, 1, and 2 with light of a wavelength of 5600 A, 6000 A and 6325 A, respectively, were measured. The values found are shown in Table 1.

TABLE 1

| λ(A) | $\alpha(cm^{-1})$ Example A | $\alpha(cm^{-1})$ Example 1 | $\alpha(cm^{-1})$ Example 2 |
| --- | --- | --- | --- |
| 5600 | 2700 | 1762 | 1465 |
| 6000 | 2000 | 1310 | 1074 |
| 6325 | 1600 | 1094 | 860 |

The anisotropy field $K_u$ of the films produced in Examples A, 3, 4 was measured. The values found, expressed in erg.ccm., are shown in the table below.

TABLE 2

| | Example A | Example 3 | Example 4 |
| --- | --- | --- | --- |
| $K_u$ | > $10^4$ | $9.6 \times 10^3$ | $6 \times 10^3$ |

All measurements were carried out at ambient temperature.

For further information on the system $Bi_2O_3\text{-}Me_2O$, reference is made to the phase diagrams published by E. M. Levin and R. S. Roth in J. Research Natl. Bur. Standards, 68A (2) 198 (1964).

Dependent on the quantity added, additions of $Me_2O$ (Me = Li, Na, K, Rb or Cs) to $Bi_2O_3$ prove to reduce the surface tension and the melting point of the mixture. (In this connection it is noted that it is general practice to add alkali metal oxides in the form of alkali metal carbonates which upon heating convert into alkali metal oxides.) A number of surface tension and melting point measurements were made both with such mixtures and with $Bi_2O_3\text{·}RO_2\text{·}Me_2O$ mixtures, and the data obtained are shown in Table 3. For comparison, values have also been measures for a pure $Bi_2O_3$ flux.

| Flux | Additive (weight %) | σ at 850° C dyne cm$^{-1}$ | Melting point ° C |
| --- | --- | --- | --- |
| $Bi_2O_3$ | | 213 | 830 |
| " | 4%$Li_2O$ | 171 | 620–640 |
| " | 4%$Na_2O$ | 157 | 600–625 |
| " | 4%$K_2O$ | 152 | 670–680 |
| " | 4%$Rb_2O$ | 168 | 730–755 |
| " | 4%$Cs_2O$ | 169 | 730–755 |
| $Bi_2O_3/CeO_2$ | 1%$K_2O$ | 175 | 0 |
| " | 2%$K_2O$ | 164 | <725 |
| " | 4%$K_2O$ | 151 | 660–675 |
| " | 6%$K_2O$ | 141 | 655–670 |
| $Bi_2O_3/SnO_2$ | 4%$K_2O$ | 166 | 670 |
| $Bi_2O_3/TiO_2$ | 4%$K_2O$ | 155 | 700 |
| $Bi_2O_3/SiO_2$ | 4%$K_2O$ | 162 | 700 |
| $Bi_2O_3/CeO_2$ | 4%$K_2O$ | 156 | 710 |
| $Bi_2O_3/CeO_2$ | 4%$Na_2O$ | 166 | 620–640 |
| " | 4%$Cs_2O$ | 155 | 720–740 |

Note:
for fluxes of the type $Bi_2O_3/MO_2$ in Table 3, the molar ratio of $Bi_2O_3$ : $MO_2$ is 98 : 2

Surface tension values are shown only for 850° C since the temperature coefficient of surface tension is small for all the systems studied. Typically, surface tension was found to increase by ~ 1% for each 100° C decrease in temperature.

Clearly the addition of alkali metal oxides has two beneficial effects. First, there is a marked lowering of the surface tension for both the $Bi_2O_3$ and $Bi_2O_3\text{-}RO_2$ fluxes. On a weight % basis $K_2O$ gives the maximum lowering of surface tension. As shown in the examples 1 to 4, garnet films have been successfully grown from both the $Bi_2O_3\text{-}Me_2O$ and $Bi_2O_3\text{-}RO_2\text{-}Me_2O$ fluxes, indicating that the $Me_2O$ addition does reduce flux adhesion to the film surface. Second, there is a substantial reduction in the film growth temperatures that can be employed. Since the garnet film composition depends on the growth temperature, extending the range of growth temperatures enables a wider variety of film compositions to be grown. In particular, the $Na_2O$ additive allows film growth temperatures ~ 200° C lower than the melting point of the $Bi_2O_3$ fluxes.

Preferably $Me_2O$ constitutes between 1 and 6% by weight of the flux mixture. If the flux contains significantly less than 1% by weight of $Me_2O$, there is no significant reduction in the melting point or surface tension of the flux relative to a similar flux containing no $Me_2O$. Similarly if the flux contains more than 6% by weight of $Me_2O$, the gain in reduction of melting point or surface tension becomes impractically small.

Mutatis Mutandis the same holds for the $RO_2$ addition. Preferably $RO_2$ constitutes between 1 and 10% by weight of the flux mixture. If the flux contains significanly less than 1% by weight of $RO_2$, there is no significant reduction in viscosity of the flux relative to a similar flux containing no $RO_2$. If the flux contains more than 10% by weight of $RO_2$, the desired result is not achieved.

EXAMPLE 5

Three melts were prepared having the same molecular ratios as the melts of Examples 1, 3 and 4 and each melt having a total weight of 125 grams. These melts were premelted in an oxygen atmosphere in platinum crucibles which were then sealed and held at 1050° C for 24 hours. They were then brought to 950° C and cooled at 2° per hour down to 600° C. The furace was then switched off. Crystals having 5 mm sides and the compositions of examples 1, 3 and 4 respectively were obtained.

Substrates consisting for example of a monocrystalline garnet and bearing a monocrystalline epitaxial bismuth rare earth iron garnet grown by the method according to the invention may be used, for example, in a thermomagnetic device, for example as outlined by J. P. Krumme et al in Appl. Phys. Letts. 20, 451 (1972), or in a magneto-optical device (see our coending application 46375/73), or in a magneto-optical bubble domain device (see an article by G. S. Alami in I.E.E. Trans. Mag. MAG-7,370 (1971), or in a magnetic bubble domain device of the types mentioned by A. H. Bobeck, R. F. Fischer and J. L. Smith in AIP Conference Proc. No. 5, 45 (1971).

We claim:

1. In the method of growing a monocrystalline bismuth rare earth iron garnet layer of the formula $Bi_p A_{3-p} D_q Fe_{5q} O_{12}$ wherein $0 < p < 3, 0 < q < 5$, A is at least one rare earth selected from those elements having atomic numbers 21, 39 and 57 to 91 inclusive and D is at least one element selected from the group consisting of gallium and aluminum by liquid phase epitaxy from a melt on a crystal face of a monocrystalline substrate, the resulting layer having the crystallographic orientation of said crystal face, said melt comprising the components of said garnet and a flux, the improvement wherein the flux is present in a concentration of 60 to 90 mol % of the melt and comprises a mixture of $Bi_2O_3$ and $Me_2O_3$ wherein Me is at least one element selected from the group consisting of Li, Na, K, Rb and Cs, $Me_2O$ is present in an amount of from 1% to 6% by weight of the melt and the molar ratio of $Bi_2O_3 : Me_2O_3$ in said flux is 100:x where the value of $x$ is such that the mixture has a viscosity of less than 16 centipoises at the growth temperature and said flux is capable of forming a eutectic composition having a eutectic temperature below the melting point of pure $Bi_2O_3$.

2. The method of claim 1 wherein in addition the flux contains the oxide $RO_2$ wherein R is at least one element selected from the group consisting of Si, Ge, Ti, Sn, Zr, Ce, Hf and Te.

3. The method of claim 2 wherein the molar ratios of $Bi_2O_3 : RO_2 : Me_2O$ in the flux are 100:x:y where the value of $x$ is such that the mixture has a viscosity of less than 16 centipoises at the growth temperature and the value of $y$ is such that the flux has a surface tension of less than 180 dyne $cm^{-1}$ at the growth temperature.

4. The method of claim 3 wherein $RO_2$ constitutes about 1–10% by weight of the composition.

5. The method of claim 3 wherein the growth temperature is between about 600°–900° C.

6. A monocrystalline substrate bearing a monocrystalline layer of a bismuth earth iron garnet grown by the method of claim 1.

* * * * *

UNITED STATES PATENT AND TRADEMARK OFFICE
CERTIFICATE OF CORRECTION

PATENT NO. : 4,077,832
DATED : March 7, 1978
INVENTOR(S) : JOHN MACKEY ROBERTSON ET AL It is certified that error appears in the above-identified patent and that said Letters Patent are hereby corrected as shown below:

Col. 8, line 2 and line 5, "$Me_2O_3$" should be --$Me_2O$--.

Signed and Sealed this

Twenty-fourth Day of June 1980

[SEAL]

Attest:

SIDNEY A. DIAMOND

Attesting Officer     Commissioner of Patents and Trademarks